United States Patent
Gospos et al.

(10) Patent No.: US 11,888,407 B2
(45) Date of Patent: Jan. 30, 2024

(54) POWER MODULE HAVING AT LEAST TWO POWER SEMICONDUCTOR ARRANGEMENTS THAT ARE CONTACTED ON A SUBSTRATE

(71) Applicant: Siemens Aktiengesellschaft, Munich (DE)

(72) Inventors: Robert Gospos, Buckenhof (DE); Lutz Namyslo, Hausen (DE); Bernd Kürten, Obermichelbach (DE); Felix Zeyss, Regensburg (DE); Michael Endres, Schesslitz (DE); Silvio Höhne, Forchheim (DE); Pietro Botazzoli, Uttenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 150 days.

(21) Appl. No.: 17/405,712

(22) Filed: Aug. 18, 2021

(65) Prior Publication Data
US 2022/0060122 A1 Feb. 24, 2022

(30) Foreign Application Priority Data
Aug. 19, 2020 (EP) .................... 20191654

(51) Int. Cl.
*H02M 7/00* (2006.01)
*H05K 5/00* (2006.01)

(52) U.S. Cl.
CPC .......... *H02M 7/003* (2013.01); *H05K 5/0065* (2013.01); *H05K 5/0091* (2013.01)

(58) Field of Classification Search
CPC ...................................................... H05K 7/00
See application file for complete search history.

(56) References Cited

U.S. PATENT DOCUMENTS

| 2016/0172995 | A1  | 6/2016 | Obiraki et al. |
| 2017/0148710 | A1* | 5/2017 | Steigler ............... H01L 23/3735 |
| 2020/0286807 | A1* | 9/2020 | Isozaki ............... H01L 23/3735 |

FOREIGN PATENT DOCUMENTS

| DE | 102015120157 A1 | 5/2017 |
| EP |      3246946 A1 | 11/2017 |
| WO | WO 2019235097 A1 | 12/2019 |

* cited by examiner

*Primary Examiner* — Jerry Wu
(74) *Attorney, Agent, or Firm* — Henry M. Feiereisen LLC

(57) ABSTRACT

A power module includes at least two power semiconductor arrangements, each having at least one semiconductor component, in contact with substrate and arranged in a housing. To improve the reliability of the power module, a first power connector and a second power connector are arranged on a first side of the housing and at least one other power connector is arranged on an opposing second side of the housing. Supply lines extending from the power connectors to the power semiconductor arrangements are arranged on the substrate in such a manner that electrical current is provided in a symmetrical manner.

17 Claims, 4 Drawing Sheets

POWER MODULE HAVING AT LEAST TWO POWER SEMICONDUCTOR ARRANGEMENTS THAT ARE CONTACTED ON A SUBSTRATE

CROSS-REFERENCES TO RELATED APPLICATIONS

This application claims the priority of European Patent Application, Serial No. 20191654.1, filed Aug. 19, 2020, pursuant to 35 U.S.C. 119(a)-(d), the content of which is incorporated herein by reference in its entirety as if fully set forth herein.

BACKGROUND OF THE INVENTION

The present invention relates to a power module, to a power converter, and to a method for producing a power module.

The following discussion of related art is provided to assist the reader in understanding the advantages of the invention, and is not to be construed as an admission that this related art is prior art to this invention.

Power converters generally have power modules that are closed by a housing, for example via a solid metal base plate, and screwed onto a cooling body. A power converter may, for example, involve a rectifier, an inverter, a converter or a DC converter. The maximum output power of power modules is in particular limited by the housing and the outer dimensions that are associated with the housing. An optimization of an arrangement of semiconductor components and current tracks with regard to the installation space can in particular lead to for example parallel connections of semiconductor components being arranged in a manner that is not electrically and thermally optimal whereby a power loss of the semiconductor components is distributed asymmetrically and the semiconductor components heat up at different intensities. Moreover, it is possible that the adjacently arranged semiconductor components mutually heat each other up, in particular too intensely, with the result that the power module fails.

It would be desirable and advantageous to provide an improved power module to obviate prior art shortcomings.

SUMMARY OF THE INVENTION

According to one aspect of the present invention, a power module includes a housing, a plurality of power connectors, with a first power connector and a second power connector being arranged on a first side of the housing and at least one other power connector being arranged on an opposing second side of the housing, a substrate, at least two power semiconductor arrangements disposed in the housing and in contact with the substrate, each power semiconductor arrangement comprising at least one semiconductor component, wherein a first of the at least two power semiconductor arrangements is arranged between a second of the at least two power semiconductor arrangements and the first and second power connectors, and supply lines disposed on the substrate and connecting the plurality of power connectors to the at least two power semiconductor arrangements so as to provide a symmetrical current supply, wherein the supply lines that connect the second power connector to the second power semiconductor arrangement are routed past the first power semiconductor arrangement symmetrically along two sides of the first power semiconductor arrangement.

According to another aspect of the invention, a power converter includes a power module in accordance with the invention.

According to yet another aspect of the invention, a method for producing a power module includes connecting a substrate to a base plate, connecting a housing in a fluid-tight manner to the base plate, and connecting a plurality of power connectors to the substrate.

The invention resolves prior art shortcomings and improving reliability of a power module, i.a., by way of a symmetrical control of semiconductor components. The semiconductor components may be part of at least two power semiconductor arrangements that are contacted on a substrate. The substrate may have a dielectric material layer having a metallization, in particular on both sides. For example, the dielectric material layer may be 25 µm to 400 µm, in particular 50 µm to 250 µm, thick and may contain a ceramic material, for example aluminum nitride or aluminum oxide or an organic material, for example a polyamide. The metallization may, for example, be provided in a structured manner and may be produced from copper. The semiconductor components may be embodied, for example, as a transistor, in particular as an insulated gate bipolar transistor (IGBT), as a metal oxide semiconductor field effect transistor (MOSFET) or as a field effect transistor, or as a diode. In particular, at least one antiparallel diode may be allocated to a transistor.

The power semiconductor arrangements may be arranged in an, in particular common, housing. The housing may have power connectors on opposite-lying sides, wherein the substrate may have supply lines from the power connectors to the power semiconductor arrangements. The supply lines may be embodied, for example, in a planar manner, wherein the supply lines that are embodied in a planar manner may be part of the, in particular structured, metallization of the substrate. A symmetrical control of the semiconductor components is achieved in that the supply lines are arranged on the substrate in such a manner that a symmetrical current supply is provided. In particular, current paths are distributed symmetrically through the power module. The symmetrical current supply leads, for example, to an identical distribution of the entire load to parallel semiconductor components whereby a serviceable life of the power module is optimized.

A first power connector and a second power connector may be arranged on at least one first side of the housing, wherein a first power semiconductor arrangement may be arranged between a second power semiconductor arrangement and the power connectors on the first side of the housing. An arrangement of this type of the power connectors and the power semiconductor arrangements saves space and renders possible a symmetrical construction of the layout, in particular in reference to a dynamic current distribution between parallel-connected semiconductor components, and a symmetrical current supply whereby a serviceable life of the power module is optimized.

Supply lines that are arranged on the substrate and that connect the second power connector to the second power semiconductor arrangement may be arranged extending on both sides and symmetrically past the first power semiconductor arrangement. For example, the supply lines may be arranged extending in a U-shape or V-shape around the first power semiconductor arrangement. A symmetrical arrangement of this type of the supply line leads to a symmetrical current supply whereby in particular parallel semiconductor components are controlled identically. A uniform control of this type leads to an optimization of the serviceable life of the power module.

According to another advantageous embodiment of the invention, the supply lines that are arranged on the substrate may be arranged extending essentially in an axis symmetrical manner with respect to a longitudinal axis. An axis symmetrical arrangement of this type of the supply line leads to a uniform control of, in particular parallel, semiconductor components.

According to another advantageous embodiment of the invention, the housing may have a protrusion, in particular extending parallel to a longitudinal axis, wherein the supply lines may be arranged at least in part below the protrusion. In particular, a housing frame may be retracted below the protrusion of the housing with the result that a greater substrate surface that is suitable for example for broader supply lines is available. Furthermore, semiconductor components can be placed at a greater distance from one another, which leads to a dissipation of heat and an improved thermal dissipation that is associated with said dissipation of heat. The reliability of the power module is improved and its serviceable life is increased by an improved thermal dissipation.

According to another advantageous embodiment of the invention, the protrusion may have bonding pads for producing a bonded connection to a power semiconductor arrangement. It is possible by way of the protrusion to realize shorter bonded connections having lesser parasitic properties, which leads to an increase in the efficiency of the power module.

According to another advantageous embodiment of the invention, the protrusion may cover at least 10% of a substrate surface. A substrate that is in part arranged below the protrusion has a surface that is enlarged by at least 11% by a protrusion of this type with the result that it is possible to achieve an increased power density of the power module.

According to another advantageous embodiment of the invention, the supply lines may be connected via connecting tabs to the second power semiconductor arrangement. The connecting tabs are embodied as curved or folded metal sheet that are produced for example from copper and are connected with a material bond to the metallization of the substrate. In particular, in comparison to bonded wires, connecting tabs of this type have a high current carrying capacity and low losses.

According to another advantageous embodiment of the invention, the first power connector and the second power connector may be embodied as DC connectors for at least one half-bridge. Empirically a circuitry of this type has proven to be particularly advantageous.

According to another advantageous embodiment of the invention, the semiconductor components of the first power semiconductor arrangement may be connected to a first metallization of the substrate with a material bond, and wherein the semiconductor components of the second power semiconductor arrangement may be connected to a second metallization of the substrate with a material bond, and wherein the first metallization is arranged insulated from the second metallization. For example, the semiconductor components of the first power semiconductor arrangement and the semiconductor components of the second power semiconductor arrangement may be connected in each case in parallel with the result that the power module that is embodied for example as a half-bridge can be easily and cost-effectively scaled by simple amendments of the layout.

According to another advantageous embodiment of the invention, the substrate may include two substrate parts that are electrically insulated from one another, wherein a first power semiconductor arrangement is arranged on a first substrate part and a second power semiconductor arrangement is arranged on a second substrate part. A separation of the substrates leads to a dissipation of heat and therefore to an improved thermal dissipation. The reliability of the power module is improved and its serviceable life is increased by an improved thermal dissipation.

BRIEF DESCRIPTION OF THE DRAWING

Other features and advantages of the present invention will be more readily apparent upon reading the following description of currently preferred exemplified embodiments of the invention with reference to the accompanying drawing, in which.

DETAILED DESCRIPTION OF PREFERRED EMBODIMENTS

Figure 1:
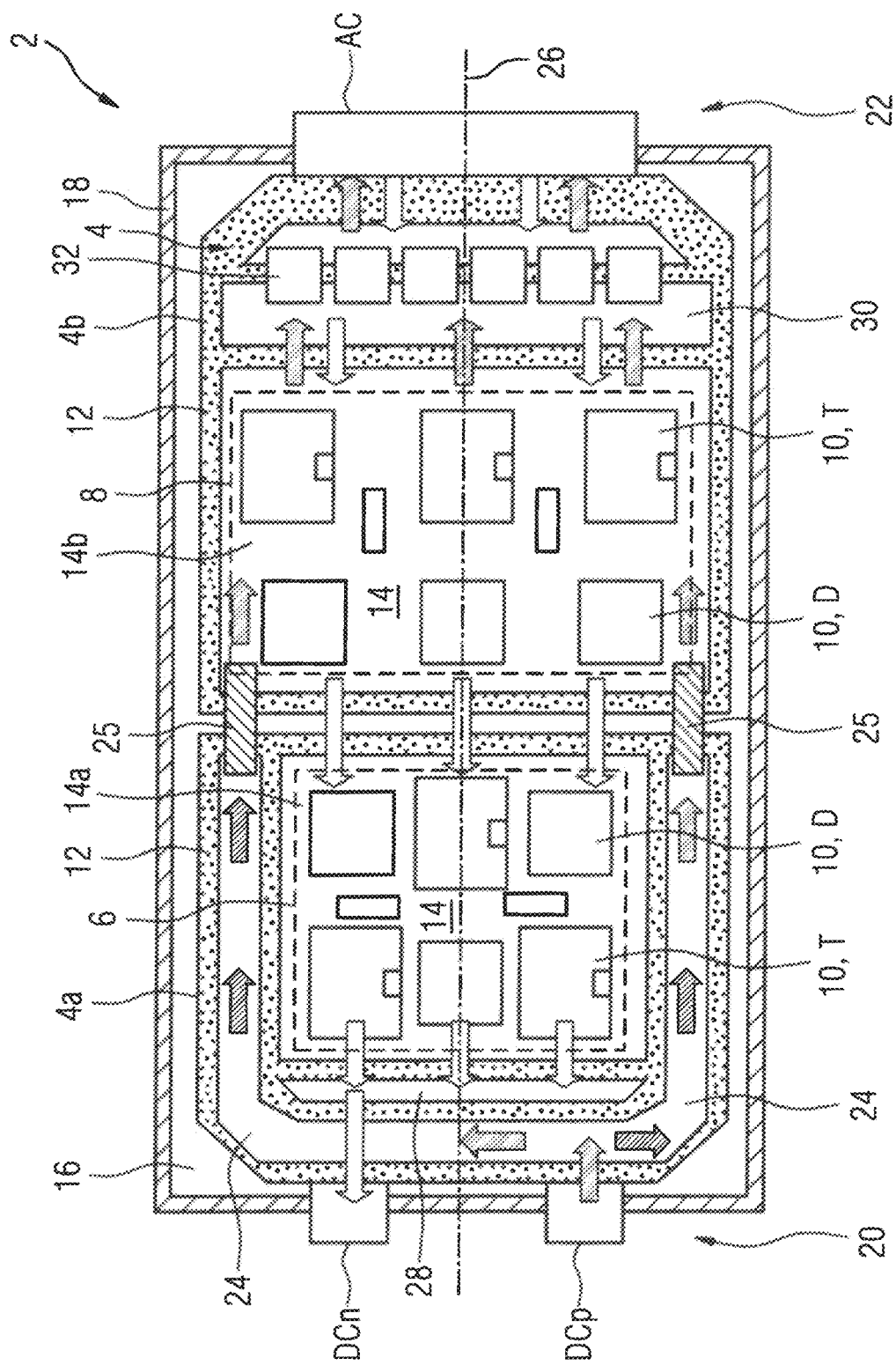
FIG. 1 shows a schematic diagram of a first embodiment of a power module.

Throughout all the figures, same or corresponding elements may generally be indicated by same reference numerals. These depicted embodiments are to be understood as illustrative of the invention and not as limiting in any way. It should also be understood that the figures are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted.

FIG. 1 illustrates in form of a schematic diagram a first embodiment of a power module 2. The power module 2 has two power semiconductor arrangements 6, 8 that are contacted on a substrate 4 and said power semiconductor arrangements have semiconductor components 10. The semiconductor components 10 are embodied in an exemplary manner as transistors T, in particular as insulated gate bipolar transistors (IGBTs), as metal oxide semiconductor field effect transistors (MOSFETs) or as field effect transistors or as diodes D. In an exemplary manner, the power semiconductor arrangements 6, 8 in each case have three transistors T and three diodes D. In particular, one antiparallel diode D is allocated to at least one transistor T. A number of the semiconductor components 10 is variable. For example, it can have a first power semiconductor arrangement 6, two transistors T and two, in particular antiparallel, diodes D that are arranged in particular in a checkered manner while a second power semiconductor arrangement 8 has two transistors T and two, in particular antiparallel, diodes D.

The substrate 4 includes two substrate parts 4a, 4b that are electrically insulated from one another, wherein the first power semiconductor arrangement 6 is arranged on a first substrate part 4a and the second power semiconductor arrangement 8 is arranged on a second substrate part 4b. The substrate 4 can also be embodied as a single piece. The substrate parts 4a, 4b of the substrate 4 have in each case a dielectric material layer 12 having a thickness of 25 µm to 400 µm, in particular 50 µm to 250 µm, with the layer containing a ceramic material, for example aluminum nitride or aluminum oxide or an organic material, for example polyamide. Furthermore, the substrate parts 4a, 4b of the substrate 4 in each case may have an, in particular, structured metallization 14 on both sides that is produced for example from copper. The substrate parts 4a, 4b of the substrate 4 are connected with a material bond to a base plate 16 that is produced for example from aluminum or an aluminum alloy. The material-bonded connection to the base plate 16 is produced by soldering or sintering.

The substrate 4 having the power semiconductor arrangements 6, 8 is arranged in a housing 18 that has power connectors DCp, DCn, AC on opposite-lying sides 20, 22 of the power module 2. As an example, a first power connector DCn and a second power connector DCp is arranged on a first side 20 of the housing 18 and said power connectors are embodied as DC power connectors, wherein the first power semiconductor arrangement 6 is arranged between the second power semiconductor arrangement 8 and the power connectors DCn, DCp on the first side 20 of the housing 18. A third power connector AC is arranged on a second side 22 of the housing 18 and said third power connector is embodied in an exemplary manner as an AC power connector. As an example, the power module 2 is embodied as a half-bridge.

Supply lines 24 that are arranged on the substrate 4 and that connect the second power connector DCp to the second power semiconductor arrangement 8 are arranged extending on both sides and symmetrically past the first power semiconductor arrangement 6. Moreover, the supply lines 24 that are arranged on the substrate 4 are essentially embodied extending in an axis symmetrical manner with respect to a longitudinal axis 26, wherein a symmetrical current supply is provided. The symmetrical current supply leads to a uniform distribution of the entire load on parallel semiconductor components 10 whereby a serviceable life of the power module 2 is optimized. The supply lines 24 that connect the second power connector DCp to the second power semiconductor arrangement 8 are connected via connecting tabs 25 to the second power semiconductor arrangement 8. Connecting tabs 25 of this type are produced for example from copper and have, in particular in comparison to bonding wires, a high current carrying capacity and low losses.

A supply line 28 that connects the first power connector DCn to the first power semiconductor arrangement 6 is likewise arranged on the substrate 4 centrally between the supply lines 24 that connect the second power connector DCp to the second power semiconductor 8 in such a manner that a symmetrical current supply is provided, which has a positive effect on the serviceable life of the power module 2. In particular, the supply line 28 that connects the first power connector DCn to the first power semiconductor arrangement 6 is likewise embodied extending in an essentially axis symmetrical manner with respect to the longitudinal axis 26. Furthermore, the supply line 30 that connects the third power connector AC to the second power semiconductor arrangement 8 is essentially embodied extending in an axis symmetrical manner with respect to the longitudinal axis 26, wherein a symmetrical current supply is provided. The supply line 30 that connects the third power connector AC to the second power semiconductor arrangement 8 has shunts 32 that are configured for example so as to measure current, wherein the shunts 32 are likewise arranged in an essentially axis symmetrical manner with respect to the longitudinal axis 26.

Figure 2:
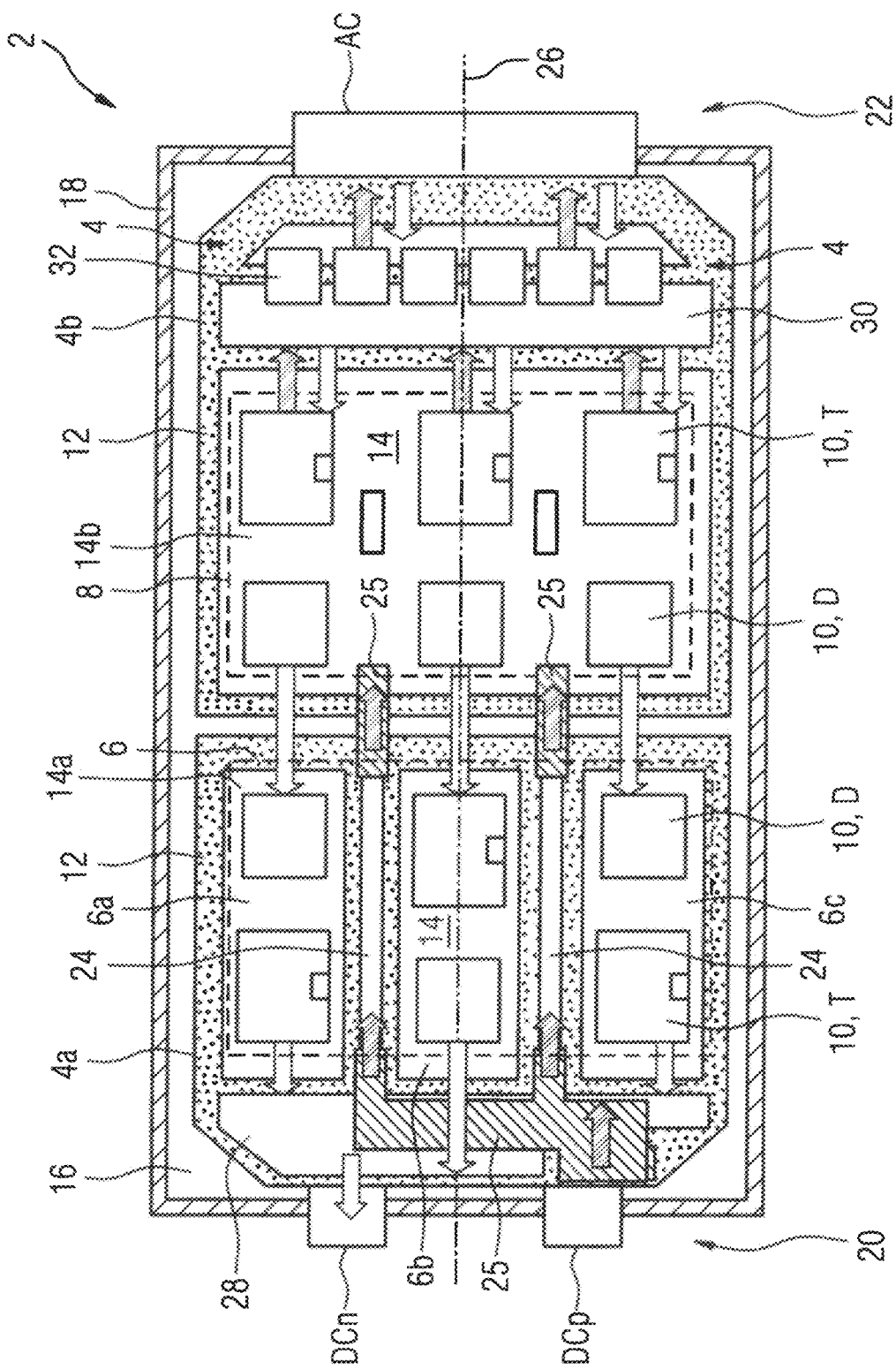
FIG. 2 shows a schematic diagram of a second embodiment of a power module.

FIG. 2 illustrates in form of a schematic diagram a second embodiment of a power module 2, wherein the first power semiconductor arrangement 6 is divided into three essentially identically sized part arrangements 6a, 6b, 6c that are arranged extending parallel and in an axis symmetrical manner with respect to the longitudinal axis 26. For example, the part arrangements 6a, 6b, 6c in each case have a transistor T having an antiparallel diode D. The supply lines 24 that connect the second power connector DCp to the second power semiconductor arrangement 8 are arranged in an axis symmetrical manner with respect to the longitudinal axis 26 between the part arrangements 6a, 6b, 6c, wherein a symmetrical current supply is provided whereby an optimal dissipation of heat is provided. The further embodiment of the power module 2 in FIG. 2 corresponds to the embodiment in FIG. 1.

Figure 3:
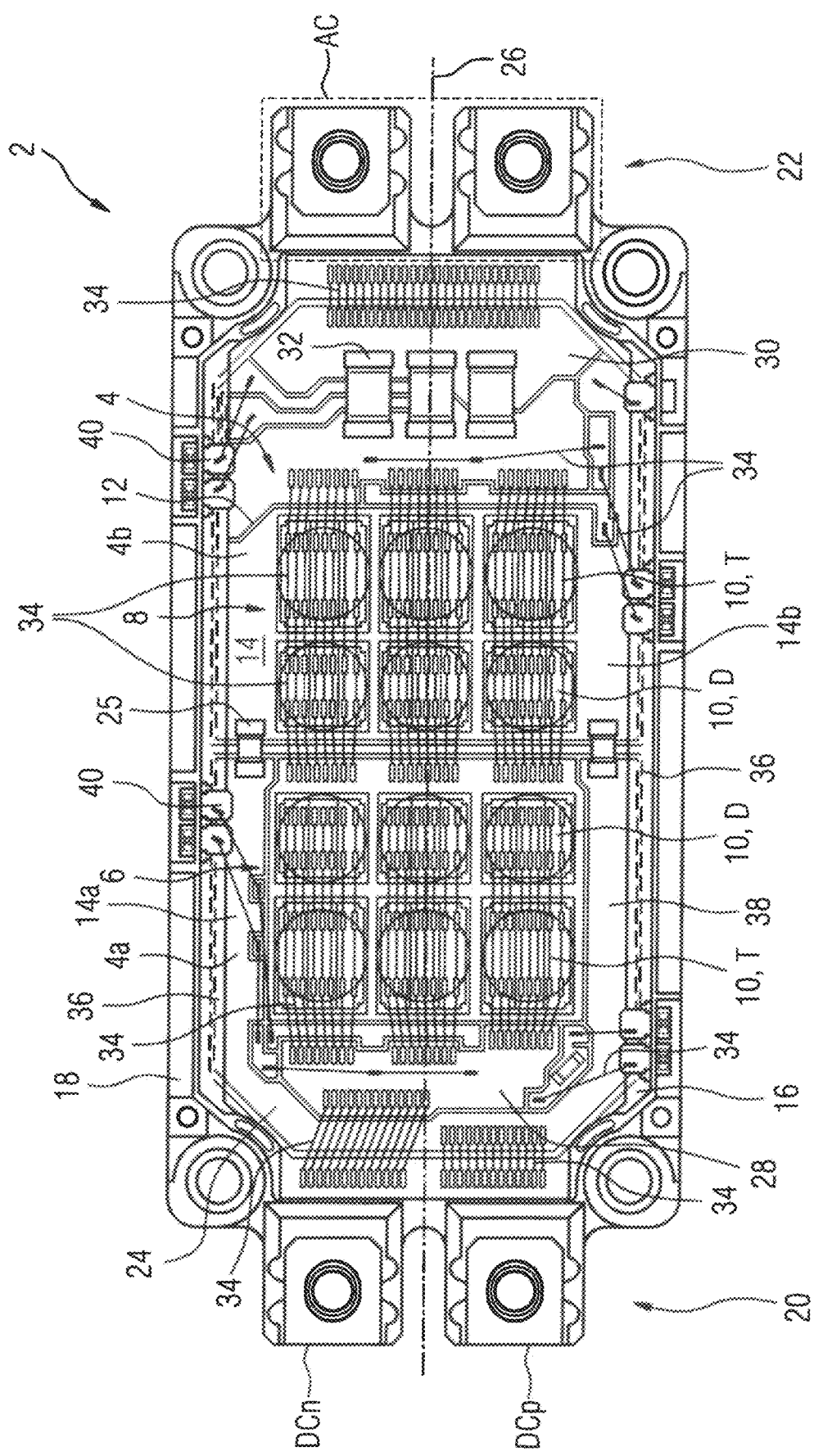
FIG. 3 shows a schematic diagram of a third embodiment of a power module.

FIG. 3 illustrates in form of a schematic diagram a third embodiment of a power module 2, wherein bonded connections 34 to the semiconductor components 10 and supply lines 24, 28, 30 are illustrated. The semiconductor components 10 of the power semiconductor arrangements 6, 8 are arranged on the substrate 4 in such a manner that current carrying bonded connections 34 extend essentially parallel to the longitudinal axis 26.

The housing 18 of the power module 2 has protrusions 36 that extend essentially parallel to the longitudinal axis 26, wherein the supply lines 24 are arranged at least in part below the protrusions 36. For example, the protrusions 36 cover at least 10% of a substrate surface 38. Moreover, the protrusions 36 have bonding pads 40 for producing a bonded connection to a power semiconductor arrangement 6, 8. The further embodiment of the power module 2 in FIG. 3 corresponds to the embodiment in FIG. 1.

Figure 4:
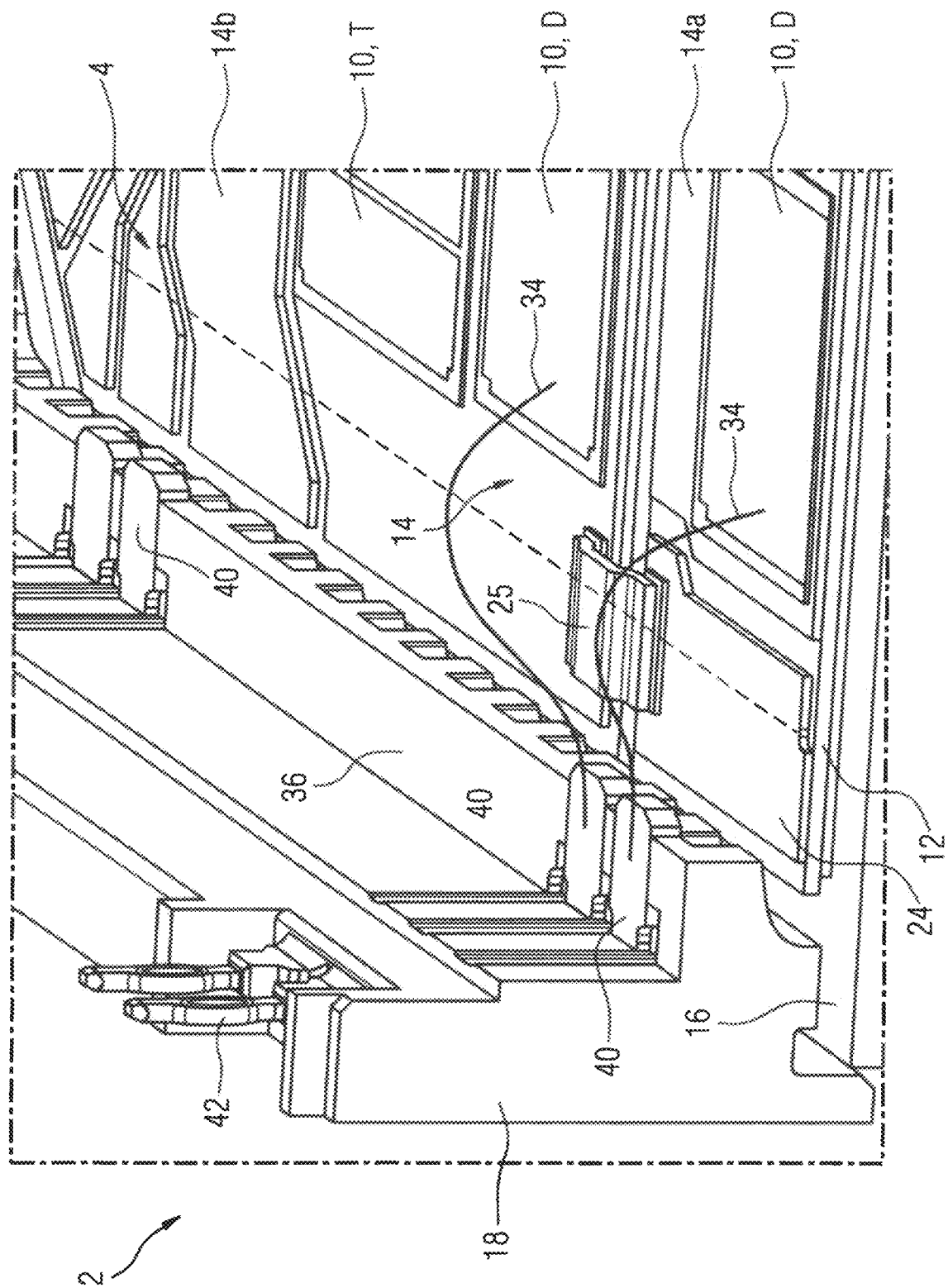
FIG. 4 shows a three-dimensional section of the third embodiment of the power module.

FIG. 4 illustrates a three-dimensional section of the third embodiment of the power module 2. The supply line 24 is located in part below the protrusion 36 of the housing 18 since the bonding surfaces of the housing 18 are not entirely supported with housing material. Installation space is gained by the protrusions with the result that the semiconductor components 10 are placed further from one another whereby this leads to an improved thermal dissipation by dissipation of heat. Moreover, the supply lines 24 can be embodied as broader owing to the additional installation space, which leads to an increased current carrying capacity. The bonding pads 40 via which bonded connections 34 to the semiconductor components 10 are produced are connected to pins 42, in particular press fit pins or solder pins, which are received in the housing 18. Further bonded connections 34 are not illustrated in FIG. 4 for the sake of clarity. The further embodiment of the power module 2 in FIG. 4 corresponds to the embodiment in FIG. 3.

In summary, the invention relates to a power module 2 having at least two power semiconductor arrangements 6, 8 that are contacted on a substrate 4 and are arranged in a housing 18. In order to improve the reliability of the power module 2, it is proposed that the power semiconductor arrangements 6, 8 in each case have at least one semiconductor component 10, wherein the housing 18 has power connectors DCp, DCn, AC on opposite-lying sides 20, 22, wherein the substrate 4 has supply lines 24 from the power connectors DCp, DCn, AC to the power semiconductor arrangements 6, 8, wherein the supply lines 24, 28, 30 are arranged on the substrate 4 in such a manner that a symmetrical current supply is provided.

While the invention has been illustrated and described in connection with currently preferred embodiments shown and described in detail, it is not intended to be limited to the details shown since various modifications and structural changes may be made without departing in any way from the spirit and scope of the present invention. The embodiments were chosen and described in order to explain the principles of the invention and practical application to thereby enable a person skilled in the art to best utilize the invention and various embodiments with various modifications as are suited to the particular use contemplated.

What is claimed as new and desired to be protected by Letters Patent is set forth in the appended claims and includes equivalents of the elements recited therein:

1. A power module, comprising:
   a housing,
   a first power connector and a second power connector being arranged on a first side of the housing and at least one other power connector being arranged on an opposing second side of the housing;
   a substrate;
   at least two power semiconductor arrangements disposed in the housing and in contact with the substrate, each power semiconductor arrangement comprising at least one semiconductor component, wherein a first of the at least two power semiconductor arrangements is arranged between a second of the at least two power semiconductor arrangements and the first and second power connectors; and
   first supply lines disposed on the substrate and connecting the second power connector to the second power semiconductor arrangement and bypassing the first power semiconductor arrangement symmetrically along two opposing sides of the first power semiconductor arrangement, and a second supply line disposed between the first supply lines and connecting the first power connector to the first power semiconductor arrangement.

2. The power module of claim 1, wherein the supply lines are routed essentially in an axis-symmetrical manner with respect to a longitudinal axis of the power module.

3. The power module of claim 2, wherein the housing has a protrusion extending parallel to the longitudinal axis, and the supply lines are arranged at least in part below the protrusion.

4. The power module of claim 3, wherein the protrusion comprises bonding pads for producing a bonded connection to at least one of the two power semiconductor arrangements.

5. The power module of claim 3, wherein the protrusion covers at least 10% of a surface area of the substrate.

6. The power module of claim 1, wherein the supply lines are connected to the second power semiconductor arrangement via connecting tabs.

7. The power module of claim 1, wherein the first power connector and the second power connector are embodied as DC connectors for at least one half-bridge.

8. The power module of claim 1, wherein the substrate comprises a first metallization and a second metallization that is insulated from the first metallization, said at least one semiconductor component of the first power semiconductor arrangement being materially bonded to the first metallization, and said at least one semiconductor component of the second power semiconductor arrangement being materially bonded to the second metallization.

9. The power module of claim 1, wherein the substrate comprises a first substrate part and a second substrate part that is electrically insulated from the first substrate part, said first power semiconductor arrangement being arranged on the first substrate part, and said second power semiconductor arrangement is arranged on a second substrate part.

10. The power module of claim 1, further comprising a base plate connected in a fluid-tight manner to the housing and connected with a material-bond to the substrate, said plurality of power connectors being connected to the substrate.

11. The power module of claim 10, wherein the plurality of power connectors are connected to the substrate via bonded connections.

12. The power module of claim 10, wherein the housing is at least in part filled with a casting compound.

13. A power converter comprising a power module, said power module comprising a housing, a first power connector and a second power connector being arranged on a first side of the housing and at least one other power connector being arranged on an opposing second side of the housing, a substrate, at least two power semiconductor arrangements disposed in the housing and in contact with the substrate, each power semiconductor arrangement comprising at least one semiconductor component, wherein a first of the at least two power semiconductor arrangements is arranged between a second of the at least two power semiconductor arrangements and the first and second power connectors, and first supply lines disposed on the substrate and connecting the second power connector to the second power semiconductor arrangement and bypassing the first power semiconductor arrangement symmetrically along two opposing sides of the first power semiconductor arrangement and a second supply line disposed between the first supply lines and connecting the first power connector to the first power semiconductor arrangement.

14. A method for producing a power module as set forth in claim 1, said method comprising:
   connecting a substrate to a base plate;
   connecting a housing in a fluid-tight manner to the base plate; and
   connecting a plurality of power connectors to the substrate.

15. The method of claim 14, wherein the substrate is connected with a material bond to the base plate.

16. The method of claim 14, wherein the plurality of power connectors are connected to the substrate via bonded connections.

17. The method of claim 14, further comprising filling the housing at least in part with a casting compound.

* * * * *

UNITED STATES PATENT AND TRADEMARK OFFICE
CERTIFICATE OF CORRECTION

| | | |
|---|---|---|
| PATENT NO. | : 11,888,407 B2 | Page 1 of 1 |
| APPLICATION NO. | : 17/405712 | |
| DATED | : January 30, 2024 | |
| INVENTOR(S) | : Robert Gospos et al. | |

It is certified that error appears in the above-identified patent and that said Letters Patent is hereby corrected as shown below:

On the Title Page

Item (56) References Cited:
Second FOREIGN PATENT DOCUMENTS
Replace "EP 3246946 A1 11/2017" with --EP 3246945 A1 11/2017--

Signed and Sealed this
Twelfth Day of March, 2024

Katherine Kelly Vidal
*Director of the United States Patent and Trademark Office*